United States Patent
Yang et al.

(10) Patent No.: US 9,287,683 B2
(45) Date of Patent: Mar. 15, 2016

(54) SEMICONDUCTOR INTERBAND LASERS AND METHOD OF FORMING

(71) Applicant: The Board of Regents of the University of Oklahoma, Norman, OK (US)

(72) Inventors: Rui Q. Yang, Norman, OK (US); Tetsuya Mishima, Norman, OK (US); Michael B. Santos, Norman, OK (US); Zhaobing Tian, Norman, OK (US); Matthew B. Johnson, Norman, OK (US); Robert T. Hinkey, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 14/571,945

(22) Filed: Dec. 16, 2014

(65) Prior Publication Data

US 2016/0013619 A1      Jan. 14, 2016

Related U.S. Application Data

(62) Division of application No. 12/975,008, filed on Dec. 21, 2010, now Pat. No. 8,929,417.

(60) Provisional application No. 61/288,701, filed on Dec. 21, 2009.

(51) Int. Cl.
| | |
|---|---|
| H01S 5/34 | (2006.01) |
| H01S 5/20 | (2006.01) |
| H01S 5/32 | (2006.01) |
| H01S 5/343 | (2006.01) |

(52) U.S. Cl.
CPC ............. *H01S 5/3401* (2013.01); *H01S 5/2031* (2013.01); *H01S 5/3211* (2013.01); *H01S 5/3402* (2013.01); *H01S 5/343* (2013.01)

(58) Field of Classification Search
CPC ..... H01S 5/3401; H01S 5/3402; H01S 5/343; H01S 5/3211
See application file for complete search history.

*Primary Examiner* — Armando Rodriguez
(74) *Attorney, Agent, or Firm* — Dunlap Codding, P.C.

(57) ABSTRACT

A semiconductor interband laser that includes a first cladding layer formed using a first high-doped semiconductor material having a first refractive index/permittivity and a second cladding layer formed using a second high-doped semiconductor material having a second refractive index/permittivity. The laser also includes a waveguide core having a waveguide core refractive index/permittivity, the waveguide core is positioned between the first and the second cladding layers. The waveguide core including an active region adapted to generate light based on interband transitions. The light being generated defines the lasing wavelength or the lasing frequency. The first refractive index and the second refractive index are lower than the waveguide core refractive index. The first cladding layer and/or the second cladding layers can also be formed using a metal.

8 Claims, 8 Drawing Sheets

SEMICONDUCTOR INTERBAND LASERS AND METHOD OF FORMING

CROSS-REFERENCE TO RELATED APPLICATIONS

The present patent application is a divisional of the patent application identified by U.S. Ser. No. 12/975,008, filed on Dec. 21, 2010 which claims benefit of U.S. Provisional Application No. 61/288,701, filed Dec. 21, 2009, which is incorporated herein by reference in its entirety.

STATEMENT REGARDING FEDERALLY SPONSORED RESEARCH OR DEVELOPMENT

This invention was made with Government support under Contract Number DMR0520550 awarded by the National Science Foundation. The Government has certain rights in the invention.

BACKGROUND OF THE INVENTION

1. Field of the Invention

This invention relates to semiconductor interband lasers and more particularly, to semiconductor mid-infrared diode lasers having improved thermal dissipation and being cable of operation in longer wavelength spectrum.

2. Brief Description of Related Art

Semiconductor lasers have been developed with emission wavelengths ($\lambda$) ranging from near- to mid-infrared ($\lambda > 3$ μm) and beyond. When the wavelength of a semiconductor laser is long, the cladding layer thickness of the waveguide structure for the laser must be made thicker. For instance, mid-infrared interband cascade (IC) lasers typically use 2-3 μm-thick InAs/AlSb superlattice (SL) as the cladding layer to confine the optical wave in a waveguide. See, e.g., Yang, "Mid-Infrared Interband Cascade Lasers Based on Type-II Heterostructures", Microelectronics J. Vol. 30, 1043 (1999); Hill, et al, "MBE Growth Optimization of Sb-Based Interband Cascade Lasers", J. Crystal Growth vol. 278, 167 (2005); Vurgaftman, et al, "Mid-infrared interband cascade lasers operating at ambient temperatures", New J. Phys. Vol. 11, 125015 (2009). The use of thick InAs/AlSb SL cladding layers in IC lasers is very demanding for growth by molecular beam epitaxy (MBE) with so many shutter movements. Furthermore, an InAs/AlSb SL layer has a very low thermal conductivity ($\kappa \sim 0.03$ W/cm·K) as indicated by Borca-Tasciuc, et al. in the paper entitled "Thermal conductivity of InAs/AlSb superlattices" published in Microscale Thermophys. Eng. Vol. 5, 225 (2001), and thick SL layers cause significant heating. Because the SL cladding layer has a refractive index (~3.37) that is only slightly smaller than that of the cascade region (3.43 to 3.47), its thickness cannot be reduced, which could lead to substantial leaking of the optical wave into the GaSb substrate (refractive index ~3.8), resulting in undesirable optical loss. This situation will become worse if SL cladding layers are still used in IC lasers for longer wavelengths because of the requirement of thicker cladding layers. Hence, if the SL cladding layer can be replaced with appropriate material, IC laser performance will improve significantly. Also, it is feasible to extend efficient IC lasers to longer wavelengths.

Therefore, it is an object of the present disclsoure to provide an improved semiconductor mid-infrared diode laser with greater thermal dissipation and being adapted to generate or emit light having a lasing wavelength longer than lasing wavelengths using previous IC lasers.

SUMMARY OF THE INVENTION

The present invention relates to a semiconductor interband laser where optical transitions occur between the conduction band and the valence band for photon emission. More particularly, but not by way of limitation, the present disclosure relates to a plasmon waveguide interband laser using a relatively high-doped semiconductor material (e.g. n+-type InAs, doped GaSb or other materials) or/and metal (e.g. Au) as the optical cladding layers to form a plasmon waveguide without using thick SL layers (e.g. InAs/AlSb SL) or ternary (e.g. AlGaSb) or quaternary (e.g. AlGaAsSb) material layers.

In one aspect, the present disclosure relates to a semiconductor interband laser. The laser has a first and second cladding layers formed using a first and a second high-doped semiconductor materials. The first high-doped semiconductor material has a first refractive index where the second high-doped semiconductor material has a second refractive index. The laser also includes a waveguide core having a waveguide core refractive index. The waveguide core is positioned between the first and the second cladding layers. The waveguide core includes an active region adapted to generate light based on interband transitions. The light being generated based on interband transitions defines the lasing wavelength (or lasing frequency) of the laser. The first refractive index and the second refractive index are lower than the waveguide core refractive index.

In accordance with another aspect, disclosed is a semiconductor interband laser. In this aspect, the laser includes a first cladding layer formed using a high-doped semiconductor material having a first permittivity and a second cladding layer formed using a metal having a second permittivity. The laser also includes a waveguide core having a waveguide core permittivity, the waveguide core is positioned between the first and the second cladding layers. The waveguide core includes an active region that is adapted to generate light based on interband transitions. The light being generated based on interband transitions defines the lasing wavelength (or lasing frequency) of the laser. The first permittivity and second permittivity are lower than the waveguide core permittivity.

In yet another aspect, disclosed is a semiconductor interband laser. The laser includes a first cladding layer formed using a metal material having a first permittivity and a second cladding layer formed using a metal material having a second permittivity. The laser also includes a waveguide core having a waveguide core permittivity, the waveguide core is positioned between the first and the second cladding layers. The waveguide core includes an active region that is adapted to generate light based on interband transitions. The light being generated based on interband transitions defines the lasing wavelength (or the lasing frequency) of the laser. The first permittivity and second permittivity are lower than the waveguide core permittivity.

The term "relatively high-doped" or simply "high-doped" semiconductor material, as used herein, refers to a semiconductor material that has a doping concentration higher than the doping concentrations typically used. Doping of semiconductor materials generally refers to the introduction of impurities into the crystalline structure to, for example, change the conductivity and/or permittivity of the semiconductor material, as is known in the art. As is also understood in the art, the permittivity of a medium (e.g., a semiconductor material) is a function of the square of the refractive index. In one aspect, the use of high-doped semiconductor material used to form the cladding layers in the present disclosure is to lower the refractive index/permittivity of the semiconductor material to less than the refractive index/permittivity of an waveguide core, having an active region, of the laser at the lasing frequency/wavelength. In another aspect, the purpose of using high-doped semiconductor materials is to increase the plasmon frequency of carriers in the semiconductor material so that the plasmon frequency of the semiconductor material is closer to the lasing frequency/wavelength of the laser. Previously, the lasing frequency is usually much higher than the plasmon frequency. When the lasing frequency is close to the plasmon frequency, the refractive index/permittivity of the material at the lasing frequency is lowered. As such, the high-doped semiconductor material can be used as a good optical cladding layer. Exemplary values of "relatively high-doped semiconductor material" is for material with doping concentrations in a range approximately from $10^{18}$ cm$^{-3}$ to $10^{19}$ cm$^{-3}$. In accordance with another aspect of the present disclosure, additional exemplary values include doping concentrations in the range approximately from $10^{18}$ cm$^{-3}$ to $10^{20}$ cm$^{-3}$ It should be understood that the level of doping will depend upon the type of semiconductor material utilized as the plasmon waveguide and can vary from the specific examples provided in this document. The cladding layers are used to confine the optical wave mainly in the active region, where the permittivity in the cladding layers is smaller than that in the active region. The active region with the higher permittivity and the cladding layers (with the lower permittivity) form a waveguide structure, where the wave is mainly propagating inside the active region. The cladding layers can be constructed of different materials, and the cladding layers can have the same level of doping, or different levels of doping.

Additionally, references herein to the plasmon frequency being "close" or "closer" to the lasing frequency are understood to refer to plasmon frequencies of the semiconductor materials used to form the cladding layers. For example, for an interband cascade laser where the refractive index of the active region is 3.42, and the emission wavelength is 6 μm ($\omega$=1660 cm$^{-1}$), it is desirable to adjust the doping so that the plasma frequency of the cladding layers is 500 cm$^{-1}$ or higher. This makes the refractive index of the cladding layers less than 3, ensuring good mode confinement.

In addition, it should be understood that although an embodiment of the plasmon waveguide interband semiconductor laser described herein is based on an InAs substrate, the idea of using a plasmon waveguide as a cladding material for a semiconductor laser is more general and can be implemented with other materials and substrates. For example, the plasmon waveguide interband cascade laser can be implemented based on a GaSb substrate with doped GaSb materials.

It should be understood that InAs has a thermal conductivity approximately 10 times higher than that of the InAs/AlSb SL. Metals that may be used for cladding such as Au and Ag have thermal conductivities that are about 100 times higher than the InAs/AlSb SL. Thus, the replacement of the SL cladding layers with doped InAs or metal layers significantly improves heat dissipation in the laser (e.g. interband cascade lasers). Also, the growth of plasmon waveguide IC laser structures by molecular beam epitaxy (MBE) without thick SL layers would be much less demanding with dramatically reduced shutter movements on many (>1000) interfaces of the SL. Other benefits with the plasmon waveguide for IC lasers are elaborated below.

The square of plasmon frequency $\omega_p^2$ (=$ne^2/m^*\epsilon_\infty\epsilon_0$) of a material is proportional to the electron concentration n, and inversely proportional to the electron effective mass m* and the high-frequency dielectric constant $\epsilon_\infty$. In n$^+$-type InAs where electron effective mass (m*=0.023m$_0$, which will increase to some degree due to non-parabolic dispersion, where m$_0$ is the free electron mass) is small and $\epsilon_\infty$=12.25, the plasmon frequency $\omega_p$ for InAs even with not very high doping concentration (<2×10$^{19}$/cm$^3$) can be comparable to the laser frequency in mid-infrared spectrum. As such, the refractive index of relatively high-doped n$^+$-type InAs can be less than 3.0, which is substantially lower than that for the cascade region (~3.43-3.47) in IC lasers. Hence, with the use of InAs plasmon layers in the cladding regions and undoped (or lightly doped) n-type InAs (refractive index near 3.5) as the separate confinement layers (SCLs), the light is more confined to the center of the waveguide and extends less into the cladding layers and substrate, as shown in FIGS. 1a and 1b, showing an example of a 10-stage two-sided plasmon-waveguide IC laser at 4.6 μm. Compared to the 20-stage regular (without SCLs) SL-cladding waveguide (FIG. 1a) and the 10-stage SL-cladding SCL (with two GaSb SCLs) waveguide (FIG. 1b), the optical mode penetration ($\Gamma_{clad}$) into the cladding regions is reduced for the plasmon waveguide where it is only about 4%. In this way, optical loss will be suppressed since only a very small portion of the optical wave is in the relatively highly-doped n$^+$-InAs cladding regions where the loss may be significantly higher. This is supported by observations of low optical losses (e.g. 6-8 cm$^{-1}$) in InAs-based quantum cascade (QC) lasers at 4.5 and 10 μm with similar plasmon-waveguide structures as described by Teissier, et al. in "Room temperature operation of InAs/AlSb quantum cascade lasers", Appl. Phys. Lett. Vol. 85, 167 (2004); and by Ohtani, et al. in "Mid-infrared InAs/AlGaSb superlattice quantum-cascade lasers", Appl. Phys. Lett. Vol. 87, 211113 (2005). In intersubband QC lasers, light emission is based on transitions between the subband states within the same band (e.g. conduction band), while in interband lasers disclosed here, light emission is based on transitions between the conduction and valence bands.

In metals, the plasma frequency falls in the ultraviolet band, and the permittivity is negative. The optical confinement in the active region will be greatly enhanced in waveguides which use metal cladding in comparison to those using semiconductor material. Also, although the optical absorption is higher in metals, it can be projected that with proper design, a low-loss waveguide can be designed due to the small penetration (<1%) into the cladding layer. Metal was used as optical cladding layer in intersubband QC lasers as described by Sirtori et at in Optics Letters vol. 23, 1366 and by Tredicucci et al in U.S. Pat. No. 7,382,806, while lasers described herein with metal cladding layers are different because they are based on interband transition.

Previous IC lasers with InAs/AlSb SL cladding layers have higher optical loss. For example, 11-17 cm$^{-1}$ at ~78 K and 28-35 cm$^{-1}$ at high temperatures (≥270 K), as described by Soibel, et al. in "Optical gain, loss and transparency current in high performance mid-IR interband cascade lasers", J. Appl. Phys. Vol. 101, 093104 (2007); and by Bewley, et al in "Gain, loss, and internal efficiency in interband cascade lasers emitting at λ=3.6-4.1 μm", J. Appl. Phys, vol. 103, article 013114 (2008). One possible reason for this high optical loss is that the SL cladding layer has a refractive index (~3.37) that is just slightly lower than the value in the cascade core region, so the laser light significantly extends into the cladding region as shown in FIG. 1 (57% and 43% for regular and SCL waveguides, respectively). The optical penetration into the SL cladding layer may even extend into the high index GaSb substrate with more optical loss when the bottom SL cladding region is not sufficiently thick (for avoiding much worse thermal dissipation). Hence, compared to IC lasers on GaSb substrates, the optical loss can be reduced in plasmon-waveguide IC lasers with much less wave penetration into the cladding regions. In addition, the plasmon-waveguide IC lasers can be grown on $n^+$-type ($1$-$3 \times 10^{18}$ cm$^{-3}$ available commercially) InAs substrates, which have a permittivity lower than that of the waveguide core region and can be used as an extra cladding layer. Also, the operating voltage can be reduced further for plasmon waveguide SCH IC lasers with fewer number of cascading stages. Consequently, the power consumption in plasmon waveguide IC lasers would be reduced significantly.

Therefore, plasmon waveguide IC lasers on InAs substrates can have better performance and efficient continuous wave (cw) operation with significantly improved thermal dissipation, reduced optical loss and power consumption. Another important feature is that plasmon waveguide IC lasers are believed to be able to achieve efficient cw operation in the longer wavelength (>6 μm) region without the difficulties associated with thick SL cladding layers. Electroluminescence from IC light emitting diodes (without cladding layers) has been demonstrated in 6-15 μm wavelength region. However, it is difficult for current IC lasers with the thick SL cladding layers to cover the longer wavelength region because the optical confinement for such a long wavelength laser light requires much thicker SL cladding layers, which not only makes the growth more challenging but also leads to much worse thermal dissipation. Hence, by circumventing thick SL cladding layers, plasmon waveguide IC lasers are capable of efficient cw operation with low power consumption in a wide range of wavelength spectrum including traditional difficult long wavelength (>6 μm) IR region for III-V interband diode lasers.

BRIEF DESCRIPTION OF THE SEVERAL VIEWS OF THE DRAWING

So that the above recited features and advantages of the present invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF EXEMPLARY EMBODIMENTS

Figure 1A:
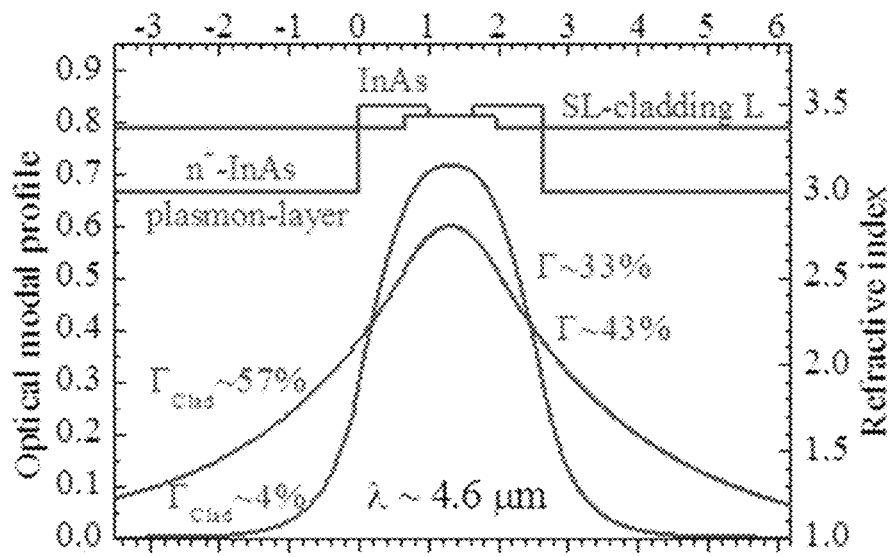
FIGS. 1(a) and 1(b) are line graphs of the simulated optical modal and refractive index profiles for a 10-stage plasmon-waveguide vs. (a) 20-stage regular, and (b) 10-stage SL-SCL IC laser structures, in accordance with the present disclosure.
Figure 1B:
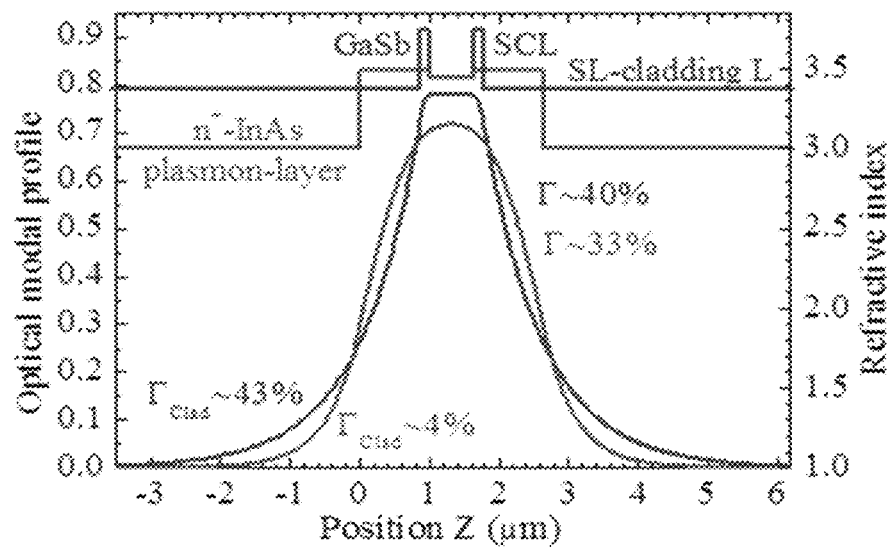

The Presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic in the interest of clarity and conciseness.

Figure 2:
FIG. 2 is a schematic diagram of a semiconductor interband laser constructed in accordance with the present disclosure.

Referring now to the drawings, and in particular to FIG. 2, shown therein and designated by reference numeral 10 is a schematic diagram of a semiconductor interband laser constructed in accordance with the present disclosure. The laser 10 includes a first cladding layer 12, a second cladding layer 14, and a waveguide core 16 positioned between the first and second cladding layers 12 and 14. The waveguide core 16 further includes an active region 18.

In a first embodiment of the laser 10, the first cladding layer 12 is formed using a first high-doped semiconductor material having a first refractive index, whereas the second cladding layer 14 is formed using a second high-doped semiconductor material having a second refractive index. In this embodiment, the first and second high-doped semiconductor materials can be the same materials, or they can be formed using different materials. That is, the first high-doped semiconductor material can be a different material than the second high-doped semiconductor material. The waveguide core 16, including the active region 18, also has a waveguide core refractive index. In a preferred embodiment of the present disclosure, the first and second refractive indexes are lower than the waveguide core refractive index.

The first and second cladding layers 12 and 14 are formed with high-doped semiconductor material having doping concentrations in a range of between $10^{18}$ cm$^{-3}$ to $10^{19}$ cm$^{-3}$. In another aspect, the doping concentrations can be in a range of between $10^{18}$ cm$^{-3}$ to $10^{20}$ cm$^{-3}$. In another aspect, the high-doped semiconductor material used to form the first and second cladding layers 12 and 14 is an $n^+$-type InAs with a doping concentration of at least $10^{18}$ cm$^{-3}$.

In a second embodiment, the first cladding layer 12 is formed using a high-doped semiconductor material having a first permittivity, whereas the second cladding layer 14 is formed using a metal having a second permittivity. In this second embodiment, the waveguide core 16, having the active region 18, also has a waveguide core permittivity. In this second embodiment, the first and second permittivity are lower than the waveguide core permittivity. As discussed above, refractive index is a function of permittivity, and vice-versa. Exemplary metals used to form the second cladding layer 14 include, but are not limited to, Ag, Au, Cu, Ti, Pt, Ni, and Pd, or combinations thereof.

In a third embodiment, the first cladding layer 12 is formed using a first metal having a first permittivity, whereas the second cladding layer 14 is formed using a second metal having a second permittivity. Similarly, the waveguide core 16, having the active region 18, has a waveguide core permittivity. In this embodiment, the first and second permittivity is lower than the waveguide core permittivity. Exemplary metals used to form the first and/or the second cladding layers 12 and 14 include, but are not limited to, Ag, Au, Cu, Ti, Pt, Ni, and Pd, or combinations thereof.

The active region 16 is adapted to generate light based on interband transitions. As would be understood in the art, the light being generated based on interband transitions thereby defines the lasing wavelength, or the lasing frequency of the laser 10. A more particular example, of an active region 16 is described herein below with respect to the following figures. In one aspect, the active region 16 can include an interband cascade region. However, other active regions are also considered within the scope of the present disclosure. In accordance with another aspect of the present disclosure, the active region 16 is adapted to generate light based on interband transitions wherein the wavelength of the light is greater than 3.0 μm.

In another aspect of the presently described embodiments, the waveguide core 16 further includes one or more separate confinement regions (SCR) positioned between the active region 16 and first cladding layer 12, and the active region 16 and the second cladding layer 14. For example, as shown in FIG. 2, the waveguide core 16 includes a first separate confinement region 20 positioned between and separating the active region 16 from the first cladding layer 12 and a second separate confinement region 22 positioned between and separating the active region 16 from the second cladding layer 14. Although the first and second separate confinement regions 20 and 22 are shown in FIG. 2 as being a single layer, it is to be understood that the regions 20 and 22 can be formed using a plurality of layers of materials. Exemplary materials that can be used to form the regions 20 and 22 include, but are not limited to, InAs, InAsSb, InGaAs, InGaAsSb, GaSb, GaInSb, AlGaSb, AlGaInSb, GaAs, AlInSb, AlSbAs, AlGaSbAs, or AlGaInSbAs, or combinations thereof. As discussed above, the materials forming the layers of the regions 20 and/or 22 can be doped, low-doped, or not doped.

Figure 3:
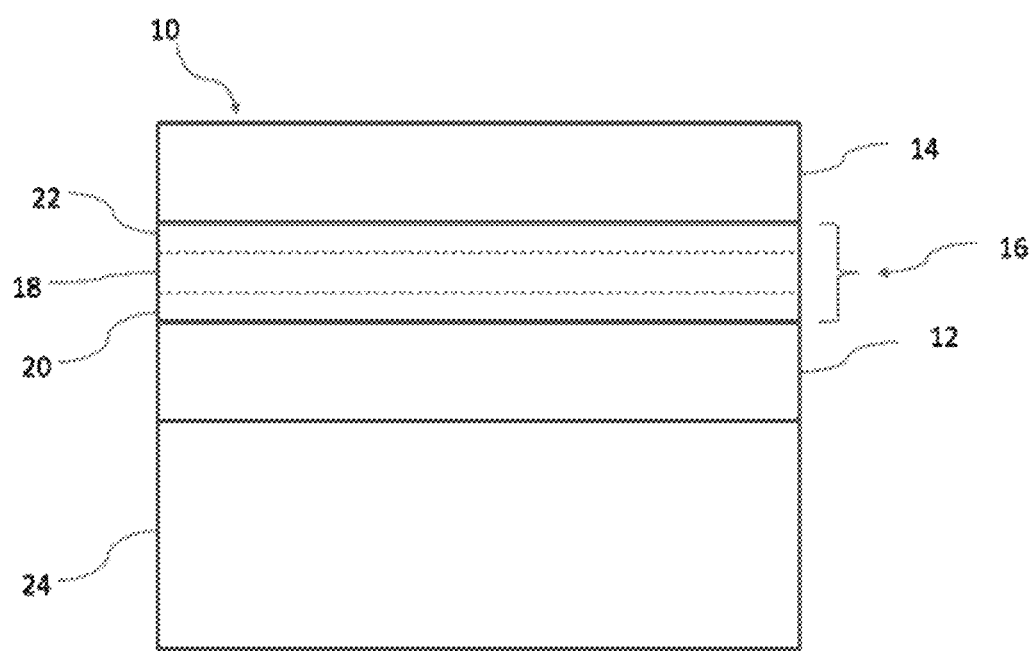
FIG. 3 is a schematic diagram of a more particular embodiment of an interband laser constructed in accordance with the present disclosure.

With reference now to FIG. 3, shown therein is schematic diagram of a more particular embodiment of the laser 10 constructed in accordance with the present disclosure. This embodiment of the laser 10 includes the first and second cladding layers 12 and 14, and the waveguide core 16 positioned between the cladding layers 12 and 14, the active region 18 separated from the cladding layers 12 and 14 by the first and second separate confinement regions 20 and 22, respectively. In this embodiment, the laser 10 is grown on a substrate 24 formed of, for example, InAs material having a substrate refractive index or permittivity. In one aspect the refractive index or permittivity of the substrate 24 is lower than the waveguide core refractive index or the waveguide core permittivity.

In another aspect, disclosed is a method of forming a semiconductor interband laser 10. The first cladding layer 12 is grown, for example, on a substrate 24 that can be InAs or other semiconductor material. The first cladding layer 12 can be formed using a high-doped semiconductor material. The material used to form the first cladding layer 12 has a first refractive index/permittivity. A waveguide core 16 is grown on the first cladding layer 12. The waveguide core 16 includes an active region 18 that is adapted to generate light based on interband transitions. The light defines the lasing wavelength or the lasing frequency of the laser 10. The waveguide core 16 has a waveguide core refractive index/permittivity. A second cladding layer 14 is grown on the waveguide core 16. The second cladding layer 14 is formed using a second high-doped semiconductor material or a metal. The material used to form the second cladding layer 14 has a second refractive index/permittivity. The first and second refractive indexes/permittivities are lower than the waveguide core refractive index/permittivity.

Figure 4:
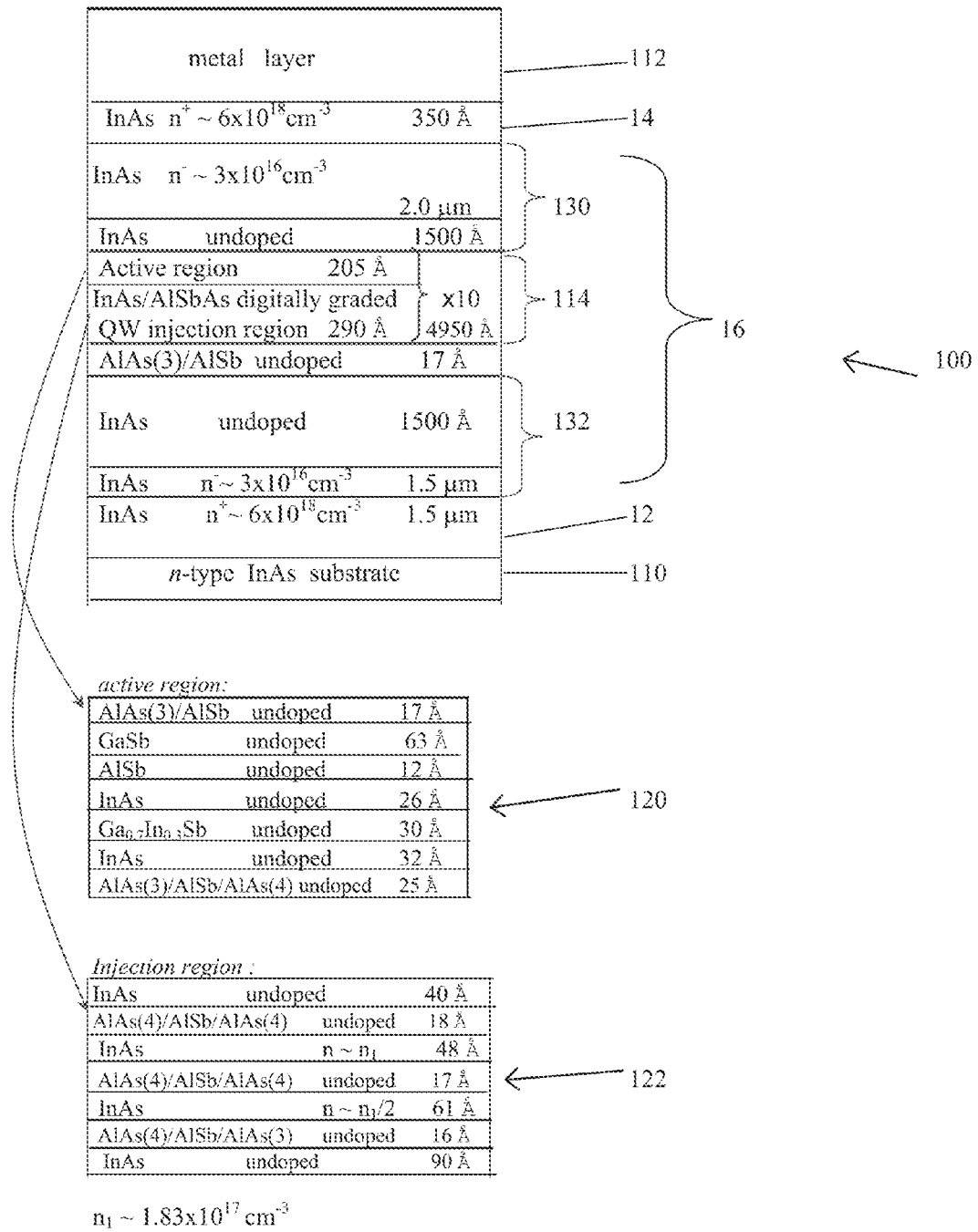
FIG. 4 is a schematic diagram of an interband cascade laser constructed in accordance with the present disclosure.

With reference now to FIG. 4, shown therein is a schematic diagram of a specific example of an IC laser 100 constructed in accordance with the present disclosure. The IC laser 100 shown in FIG. 4 was grown in a Gen II molecular beam epitaxy (MBE) system on an n-type InAs substrate 110, with the exception of a top metal layer 112 that was deposited in a thermal evaporator after MBE growth. The laser 100 comprises an interband cascade region 114 having a thickness of 495 nm. In the embodiment shown in FIG. 4, the cascade region 114 consists of 10 alternating active regions 120 and injection regions 122. The active region 120 and the injection region 122 form an interband cascade stage that has a thickness of 495 Å. A cascade stage comprises many layers that are made of compound semiconductor materials InAs, Ga(In)Sb, AlSb with AlAs interfaces for balancing compressive strain from AlSb and Ga(In)Sb layers. For the example shown in FIG. 4, the thickness of each layer is specified and was designed for lasing at ~5.5 μm at a temperature of ~80K. These 10 cascade stage region 114 is sandwiched by SCL regions 130 and 132 that are made of undoped or slightly doped InAs. In the embodiment shown in FIG. 4, the cascade region 114 and the SCL regions 130 and 132 form the waveguide core 16 discussed above that is sandwiched by the first and second cladding layers 12 and 14. In this embodiment, the first and second cladding layers 12 and 14 are formed using two high doped n-type InAs materials that were heavily doped with Si up to $6\times10^{18}$ cm$^{-3}$ in this example. The InAs first cladding layer 12 is 1.5-μm thick and serves as the bottom optical cladding layer in the example shown in FIG. 4. The top InAs second cladding layer 14 is only 35-nm thick and thus is too thin to confine an optical wave at a mid-infrared wavelength. In this embodiment, the top InAs second cladding layer 14 is used as a metal contact layer. Above the second cladding layer 14, a metal layer 112 is deposited with a typical thickness of 200 to 300 nm, which serves as the top optical cladding layer to confine the optical wave in the waveguide.

Semiconductor laser devices can be manufactured by any known processes. The IC laser structure shown in FIG. 4 was processed into deep-etched 150-μm-wide mesa-stripe and narrow (~15 or 20 μm-wide) ridge laser devices, both with metal contacts on the top layer and bottom substrate. Laser bars were cleaved to form 1.5-mm to 2.0-mm-long cavities, with both facets left uncoated. The laser bars were affixed with indium, epilayer side up, onto a copper heat-sink and then mounted onto the temperature-controlled cold finger of an optical cryostat for testing at temperatures of ≥82K.

Figure 5:
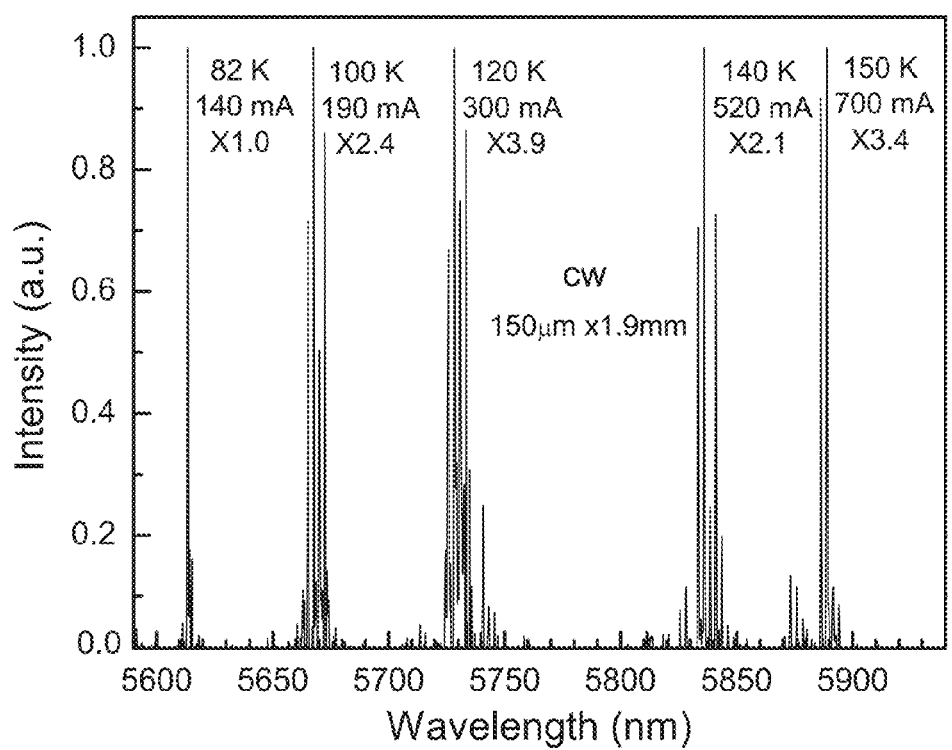
FIG. 5 is a graph illustrating laser spectra (normalized as indicated) of a 150-μm-wide mesa-stripe laser (device 2H, just above threshold) in cw mode and at several temperatures, constructed in accordance with the laser shown in FIG. 4.
Figure 6:
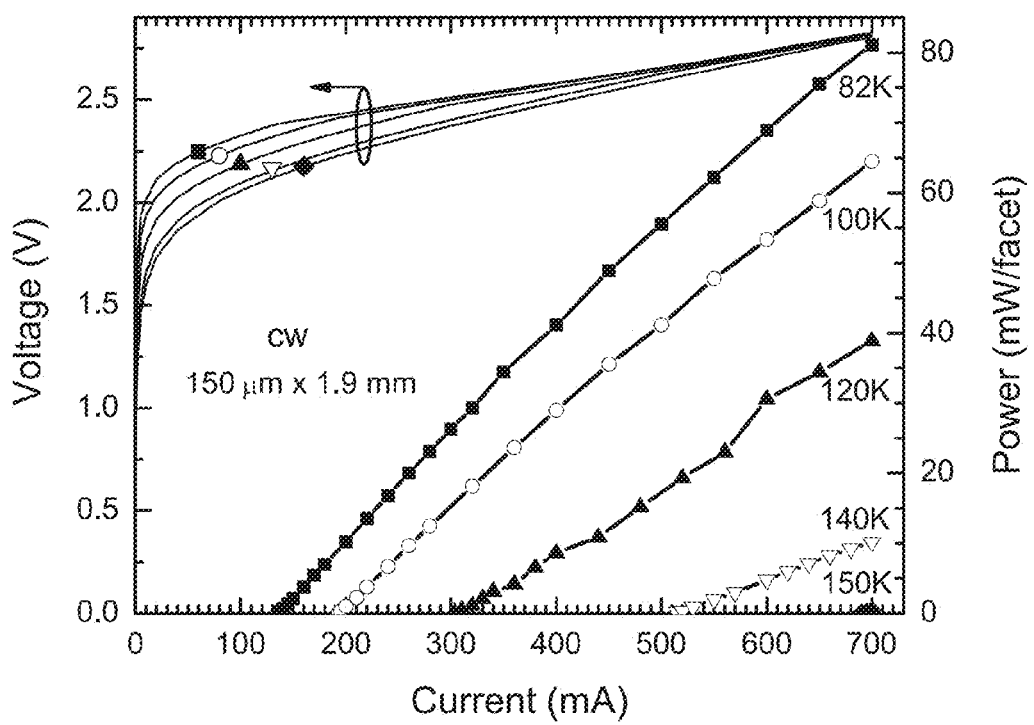
FIG. 6 is a graph showing the current-voltage-light (I-V-L) characteristics of the device 2H in cw mode at several temperatures, the temperature for the I-V curves being indicated by the label on the curve, in accordance with one aspect of the present disclosure.

With reference now to FIG. 5, shown therein is a spectra showing cw lasing spectra of a 150-μm-wide by 1.9-mm-long mesa-stripe laser (denoted as device 2H) at temperatures from 82 K to 150 K with lasing wavelength from 5.6 to 5.9 μm in good agreement with the design. The current-voltage-light (I-V-L) characteristics are shown in FIG. 6. The output power of this laser exceeded 80 mW/facet at 82 K with a threshold current density of ~49 A/cm$^2$, which is the lowest ever reported for diode lasers operating in the wavelength region beyond 5.5 μm. The threshold voltage was ~2.38 V at 82 K, which is only about 0.17 V higher than the minimal required bias voltage for the 10-stage IC laser. This demonstrates the efficient use of bias voltage in Plasmon waveguide IC lasers. The specific thermal resistance for the broad-area device was estimated to be ~23 Kcm²/kW at 140 K. This value is lower than the typical specific thermal resistance for broad-area IC lasers, which suggests an improvement in thermal dissipation for InAs plasmon waveguide IC lasers 10 and 100 over IC lasers using InAs/AlSb SL cladding layers.

Figure 7:
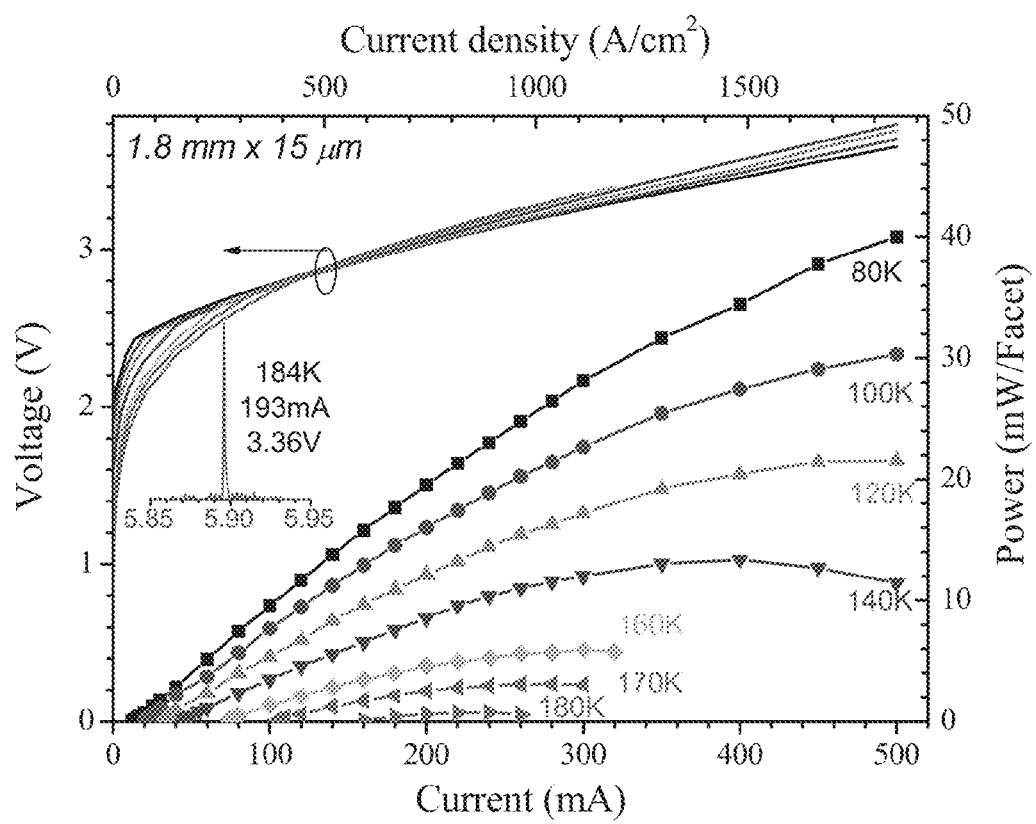
FIG. 7 is a graph showing the I-V-L characteristics of a narrow ridge laser, constructed in accordance with the laser shown in FIG. 4, in cw mode at various temperatures, the heat-sink temperature for the I-L curves being labeled beside the curves, showing the laser spectrum at 184K in the inset.

FIG. 7 shows current-voltage-light (I-V-L) characteristics of a narrow-ridge (15 µm) device with a cavity length of 1.80 mm. It lased up to 184 K at 5.9 µm in cw mode (see inset FIG. 7), with a threshold current density of 52 A/cm² at 80 K. The output power of this laser exceeds 40 mW/facet, with a slope efficiency of ~100 mW/A per facet. There is no sign of saturation in the I-L curve with an injection current density of ~2 kA/cm² at 80 K.

Figure 8:
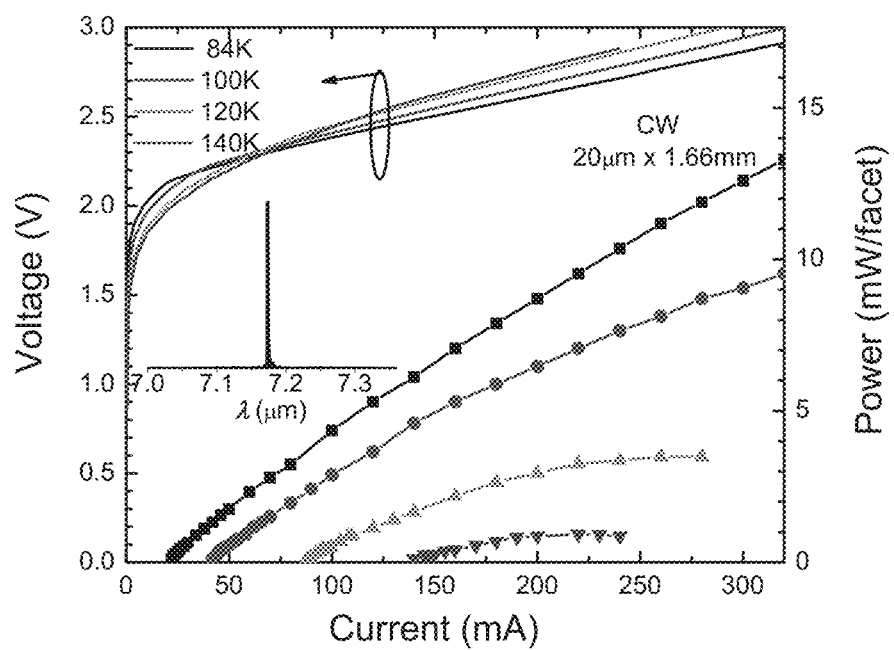
FIG. 8 is a graph showing the I-V-L characteristics of a narrow ridge laser operating in cw mode at various temperatures, the laser spectrum at 141 K being shown in the inset, in accordance with the present disclosure.

In summary, a new type of IC laser 10 and 100 has been demonstrated on an InAs substrate with cw operation up to 184 K near 6 µm. This represents a significant advance in the development of III-V mid-IR interband diode lasers. By adjusting layer thickness of the active region 120 and injection region 122, longer wavelength IC lasers can be achieved. Such wavelength flexibility is illustrated in FIG. 8 showing current-voltage-light (I-V-L) characteristics of a narrow-ridge (20 µm) device with a cavity length of 1.66 mm. It lased up to 141 K near 7.2 µm in cw mode (see inset FIG. 8).

In one aspect of the present disclosure, the example shown in FIG. 4 and described above is for an IC laser 10 and/or 100 that uses one highly doped semiconductor plasmon layer and one metal layer as optical cladding layers. It should be understood that two highly doped semiconductor Plasmon layers with adequate layer thickness (>1 µm) can be used as the first and the second cladding layers 12 and 14, respectively, to form a two-sided semiconductor Plasmon waveguide. Also, the substrate can be even removed by known techniques so that a metal layer can be deposited directly adjacent to the bottom n⁺-type InAs first cladding layer 12 to form a double-metal waveguide, in which layer 12 can be very thin (e.g. tens-hundreds of nm) because the metal layer can be used as the bottom optical cladding layer.

It will be understood from the foregoing description that various modifications and changes may be made in the preferred and alternative embodiments of the present invention without departing from its true spirit. For example, the active region 120 and an injection region 122 of the IC laser 100 can be constructed in a variety of manners and with various materials, and thicknesses of materials/layers. This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

REFERENCES

U.S. PATENT DOCUMENTS: U.S. Pat. Nos. 6,301,282; 5,588,015; 5,799,026; 5,502,787; and 7,382,806

OTHER PUBLICATIONS

J. Z. Tian, R. Q. Yang, T. D. Mishima, M. B. Santos, and M. B. Johnson, "Plasmon-Waveguide Interband Cascade Lasers Near 7.5 mm", Photonics Technol. Lett. 21, 1588 (2009).

Rui Q. Yang, "Infrared Laser based on Intersubband Transitions in Quantum Wells", Superlattices and Microstructures, vol. 17 (1), pp. 77-83, 1995.

R. Q. Yang, "Mid-Infrared Interband Cascade Lasers Based on Type-II Heterostructures" Microelectronics Journal, vol. 30 (10), pp. 1043-1056, 1999.

Ruin Q. Yang, "Novel Concepts and Structures for Infrared Lasers", Chap. 2, in *Long Wavelength Infrared Emitters Based on Quantum Wells and Superlattices*, edited by M. Helm (Gordon & Breach Pub., Singapore, 2000).

C. Sirtori et al., Long wavelength . . . , Appl. Phys. Lett., vol. 69, No. 19, pp. 2810-2812 (1996).

Mansour, K., Qiu, Y., Hill, C. J., Soibel, A., and Yang, R. Q.: 'Mid-IR interband cascade lasers at thermoelectric cooler temperatures', *Electron. Lett.*, 2006, 42 (18), pp. 1034-1035.

Z. Tain, R. Q. Yang, T. D. Mishima, M. B. Santos, R. T. Hinkey, M. E. Curtis, M. B. Johnson, "InAs-based interband cascade lasers near 6 mm", Electronics Letters, 45, 48 (2009).

Yang, R. Q., Hill, C. J., Mansour, K., Qiu, Y., Soibel, A., Muller, R., and Echternach, P.: 'Distributed feedback mid-infrared interband cascade lasers at thermoelectric cooler temperatures', *IEEE J. Selected Topics of Quantum Electronics*, 2007, 13, pp. 1074-1078.

Vurgaftman, C. L. Canedy, C. S. Kim, M. Kim, W. W. Bewley, J. R. Lindle, J. Abell, and J. R. Meyer, "Mid-infrared interband cascade lasers operating at ambient temperatures", New J. Phys. 11 125015 (2009)

Kim, M., Canedy, C. L., Bewley, W. W., Kim, C. S., Linda, J. R., Abell, J., Vurgaftman, I., and Meyer, J. R.: 'Interband cascade laser emitting at λ=3.75 µm in continuous wave above room temperature', *Appl. Phys. Lett.*, 2008, 92, p. 191110.

Hill, C. J., and Yang, R. Q.: 'MBE Growth Optimization of Sb-Based Interband Cascade Lasers', *J. Crystal Growth*, 2005, 278, pp. 167-172.

Soibel, A., Mansour, K., Qiu, Y., Hill, C. J., and Yang, R. Q.: 'Optical gain, loss and transparency current in high performance mid-IR interband cascade lasers', *J. Appl. Phys.*, 2007, 101, p. 093104.

Ohtani, K., and Ohno, H.: "An InAs-Based Intersubband Quantum Cascade Laser", *Jpn. J. Appl. Phys.*, 2002, 41, p. L1279.

Sirtori, C., Gmachl, C., Capasso, F., Faist, J., Sivco, D. L., Hutchinson, A. L., and Cho, A. Y.: "Long-wavelength (λ≈8-11.5 µm) semiconductor lasers with waveguides based on surface plasmons", *Optics Letters*, 1998, 23, p. 1366-1368.

Teissier, R., Barate, D., Vicet, A., Yarekha, D. A., Alibert, C., Baranov, A. N., Marcadet, X., Garcia, M., and Sirtori, C.: "InAs/AlSb quantum cascade lasers operating at 6.7 µm", *Electron. Lett.*, 2003, 39, pp. 1252-1253.

What is claimed is:

1. A semiconductor interband laser comprising:
a first cladding layer formed using a metal material having a first permittivity;
a second cladding layer formed using a metal material having a second permittivity; and
a waveguide core having a waveguide core permittivity and being positioned between the first and the second cladding layers, the waveguide core including an active region to generate light based on interband transitions, the light defining a lasing wavelength;
wherein the first permittivity and second permittivity are lower than the waveguide core permittivity.

2. The semiconductor interband laser of claim 1, wherein the waveguide core further includes one or more separate confinement regions positioned between the active region and first cladding layer and the active region and the second cladding layer, the one or more separate confinement regions including one or more layers of semiconductor material having a permittivity higher than the first and second permittivity.

3. The semiconductor interband laser of claim 2, wherein the semiconductor material forming the one or more separate confinement regions is selected from the group consisting of InAs, InAsSb, InGaAs, InGaAsSb, GaSb, GaInSb, AlGaSb, AlGaInSb, GaAs, AlInSb, AlSbAs, AlGaSbAs, and AlGaInSbAs.

4. The semiconductor interband laser of claim 1, wherein the active region is comprised of an interband cascade region.

5. The semiconductor interband laser of claim 1, wherein the active region of the waveguide core includes one or more semiconductor layers selected from the group consisting of InAs, InAsSb, InGaAs, InGaAsSb, GaSb, GaInSb, AlGaSb, AlGaInSb, GaAs, AlSb, AlAs, AlInSb, AlSbAs, AlGaSbAs, and AlGaInSbAs.

6. The semiconductor interband laser of claim 1, wherein the lasing wavelength is greater than 3.0 µm.

7. The semiconductor interband laser of claim 1, wherein the metal material forming the first and second cladding layer is selected from the group consisting of Ag, Au, Cu, Ti, Pt, Ni, and Pd.

8. The semiconductor interband laser of claim 1, wherein the laser is grown on a substrate material selected from the group consisting of InAs and GaSb.

* * * * *